US006686132B2

(12) United States Patent
Cheng et al.

(10) Patent No.: US 6,686,132 B2
(45) Date of Patent: Feb. 3, 2004

(54) METHOD AND APPARATUS FOR ENHANCING RESIST SENSITIVITY AND RESOLUTION BY APPLICATION OF AN ALTERNATING ELECTRIC FIELD DURING POST-EXPOSURE BAKE

(75) Inventors: MoSong Cheng, Berkeley, CA (US); Andrew R. Neureuther, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 28 days.

(21) Appl. No.: 09/840,638

(22) Filed: Apr. 20, 2001

(65) Prior Publication Data

US 2003/0008246 A1 Jan. 9, 2003

(51) Int. Cl.⁷ .................................................. G03F 7/00
(52) U.S. Cl. ....................................... 430/325; 430/313
(58) Field of Search .............................. 430/311, 325, 430/330, 30, 313

(56) References Cited

U.S. PATENT DOCUMENTS

| | | | | |
|---|---|---|---|---|
| 4,626,338 A | * | 12/1986 | Kondo et al. | 204/406 |
| 5,158,861 A | | 10/1992 | Tokui et al. | 430/325 |
| 5,258,266 A | | 11/1993 | Tokui et al. | 430/326 |
| 5,626,782 A | | 5/1997 | Maeda | 219/449 |
| 5,707,784 A | * | 1/1998 | Oikawa et al. | 430/311 |
| 5,717,612 A | | 2/1998 | Capodieci | 364/578 |
| 5,834,326 A | * | 11/1998 | Miyachi et al. | 438/29 |
| 5,989,788 A | * | 11/1999 | Bae et al. | 430/324 |
| 6,242,164 B1 | * | 6/2001 | Choi et al. | 430/311 |
| 6,296,984 B1 | * | 10/2001 | Gabor et al. | 430/270.1 |

OTHER PUBLICATIONS

Cheng et al. (2000), "Enhancement of Resist Resolution and Sensitivity via Applied Electric Field," *J. Vac. Sci. Technol. B* 18(6):3318–3322.

Conley (1996), "Photoresist Technology for 0.25 $\mu$m Lithography," *Semiconductor Fabtech* 5:201.

Croffie et al. (1999), "Moving Boundary Transport Model for Acid Diffusion in Chemically Amplified Resists," *J. Vac. Sci. Technol. B* 17(6):3339–3344.

Fukuda et al., "Impact of Acid/Quencher Behavior on Lithography Performance," *SPIE* 34(12):4346.

Hattori et al. (2000), "Analysis of Quencher Diffusion in Chemically Amplified Resists and Its Effect on Imaging Characteristics," *Journal of Photopolymer Science and Technology* 13(3):477–484.

Kanda et al. (2000), "Advanced Microlithography Process with Chemical Shrink Technology," *Proceeding of SPIE, Advances in Resist Technology and Processing XVII*, vol. 3999, Paper 94.

Pawlowski et al. (1996), "Acetal–Based DUV Photoresists for Sub–Quarter Micron Lithography," *Semiconductor Fabtech* 6:215.

* cited by examiner

*Primary Examiner*—Mark F. Huff
*Assistant Examiner*—Kripa Sagar
(74) *Attorney, Agent, or Firm*—Reed & Eberle LLP; Shelley P. Eberle; Louis L. Wu (57) ABSTRACT le;.5qA method for enhancing resist sensitivity and resolution based on influencing the effects of photoacid drift and diffusion by an externally applied electric field that may optionally include a direct current offset bias is disclosed. An electric field applied to the resist film during post exposure bake (PEB) enhances photoacid drift in the direction of the applied electric field, reduces bake time, and results in less undesired diffusion. Electric-field enhanced PEB can reduce PEB time by about 30%, and at the same time, improve the sharpness of 2D corners and increase the verticality of resist sidewalls. Electric-field-enhanced PEB also significantly improves the tolerance of over-exposure and provides better critical dimension control. It is estimated that the lateral acid diffusion length is reduced by about 50%. An apparatus for carrying out the aforementioned method is also provided.

61 Claims, 8 Drawing Sheets

METHOD AND APPARATUS FOR ENHANCING RESIST SENSITIVITY AND RESOLUTION BY APPLICATION OF AN ALTERNATING ELECTRIC FIELD DURING POST-EXPOSURE BAKE

TECHNICAL FIELD

This invention relates generally to the fields of lithography, and semiconductor fabrication. More particularly, the invention relates to a method for enhancing resist sensitivity and resolution by influencing the effects of photoacid drift/diffusion by an external alternating electric field that may optionally include a direct current offset bias. The claimed method is useful in processing lithographic photoresist compositions, particularly chemical amplification photoresist compositions including ultraviolet, electron-beam, and x-ray photoresists.

BACKGROUND

Chemically amplified resists are based on the acid-catalyzed deprotection of functional groups in a polymer matrix. During the postexposure bake (PEB) step, several chemical and physical processes take place. In positive resists, photogenerated acid (or simply "photoacid") catalyzes the deblocking process, in which the blocked insoluble polymer is converted to a soluble polymer with hydroxyl group and a volatile component. The volatile group then generates transient free volume that augments diffusion pathways. See Croffle et al. (1999) *J. Vac. Sci. Techno.B* 6(17):3339–3344 for a further discussion of the effects of transient free volume. In negative resists, photoacid catalyzes crosslinking, thereby rendering the crosslinked areas insoluble. In either type of resist the photoacid can be deactivated by neutralization and evaporation, or be trapped due to lack of diffusion pathways. In some resist systems the photoacid can also be deactivated by substrate or air contamination. The end result of unwanted photoacid deactivation and diffusion is alteration in the shape of the developed photoresist. This alteration may take the form of reduced two-dimensional sharpness in corner sections, and/or reduced verticality of resist sidewalls, and ultimately results in greatly reduced critical dimension control.

In order to prevent changes in pattern shape caused by diffusion or deactivation of the acid, the PEB is generally carried out immediately after the exposure. Additionally, radiation exposure time and PEB time and temperature are closely monitored, as overexposure and overbaking also increase the changes in pattern shape caused by diffusion. As a consequence, the prior methods provide a limited processing window.

U.S. Pat. No. 5,626,782 to Maeda discloses an apparatus for controlling the changes due to diffusion and deactivation in negative resists by delaying PEB. The delay in PEB allows the photoacid to diffuse into the unexposed areas of the resist so that when the resist undergoes PEB, the crosslinked areas produced by the diffused photoacid encroach into the unexposed areas. The encroachment of the diffused photoacid into the unexposed areas renders the encroached areas insoluble in the developer, thereby reducing the width of the unexposed areas and allowing for the formation of features having smaller dimensions than those originally patterned into the resist. The elapsed time from exposure to PEB is input into the apparatus, which then calculates the optimal PEB time and temperature required to achieve the desired degree of encroachment and desired feature width. Methods of predicting the anticipated photoacid diffusion characteristics are also disclosed in, for example, U.S. Pat. No. 5,717,612 to Capodieci. Although the Maeda et al. apparatus utilizes anticipated diffusion to control image features, the apparatus is only applicable to negative resists and does not actually influence the preferential movement of photoacid diffusion per se.

Kanda et al. (2000) *Proc. SPIE Int. Soc. Opt. Eng.* 3999:881–889, discloses a two-step process wherein a coating material is applied to a negative resist that has already been exposed and had the uncrosslinked, unexposed sections removed. Once the resist is coated with a coating material comprised of a water-soluble polymer and a crosslinker, the coated resist is subjected to a second baking step wherein a layer of the coating material is crosslinked by the diffusion of acid remaining in the resist. The acid present in the original crosslinked resist diffuses into the coating material and catalyzes crosslinking so that the water-soluble polymer is rendered water-insoluble. In this way, the dimensions of the initially unexposed areas of the resist may be reduced. Unfortunately, this method requires second coating, baking, and developing steps that greatly add to the complexity and cost of resist fabrication.

Attempts to reduce diffusion through incorporation of an additive or latent image stabilizer (LIST) have also been made. Using this method, comparatively small concentrations of alkaline materials, such as tertiary amines, are incorporated into the resist material and work via a simple neutralization reaction. More sophisticated approaches use photodestructable bases (PDB) such as triphenylsulfonium hydroxide (TPSH), which, upon exposure, is converted into water and neutral organic species that do not interfere with the acid. S. Funato et al. (1995) *J. Photopolym. Sci. Technol.* 8(3):543. The effects of quenchers in chemically amplified resists is also discussed in Fukuda et al. (2000) *SPIE* 12(34):4346 and Hattori et al. (2000) *J. Photopolymer Sci. and Technol.* 13:477–484. Unfortunately, all of these methods require additional additives that add to the cost of resist processing and do not include treatments that influence the preferential movement or reaction of the photoacid.

For the purposes of critical dimension (CD) control, it is desired to enhance the effects of the photoacid in a particular direction, i.e., in the vertical direction, thereby limiting the relative lateral photoacid diffusion. Since the photoacid carries a positive charge, an external electric field applied to the resist film can force the photoacid to drift in a given direction. The present invention provides a method for improving resist resolution by reducing the relative effect of photoacid drift by influencing the movement of the photoacid with an external electric field that may optionally have a DC offset bias.

SUMMARY OF THE INVENTION

Accordingly, it is a primary object of the invention to address the above-described need in the art by providing a novel method for reducing the effect of photoacid diffusion in photoresists, particularly chemically amplified photoresists.

It is another object of the invention to provide a method for improving the sharpness of two-dimensional corners in chemically amplified photoresists.

It is still another object of the invention to provide a method for improving the verticality of sidewalls in chemically amplified photoresists.

It is yet another object of the invention to provide a method for improving the overexposure tolerance in chemically amplified photoresists.

It is still another object of the invention to provide a method for improving critical dimension control in chemically amplified photoresists.

Additional objects, advantages and novel features of the invention will be set forth in part in the description which follows, and in part will become apparent to those skilled in the art upon examination of the following, or may be learned by practice of the invention.

In one embodiment, then, the present invention provides a process for generating a resist image on a substrate by providing a substrate coated with a film of a photoresist composition comprised of a resist binder and a radiation-sensitive acid generator, exposing the film selectively to a predetermined pattern of radiation, subjecting the exposed film to postexposure baking while applying an alternating electrical field to the exposed film, so as to form a latent, patterned image in the film, and developing the latent image with a developer.

Another embodiment of the invention provides an apparatus for postexposure-baking of an exposed chemical amplification resist on a substrate surface, comprising: a heat source for generating heat in a first direction; a means for applying an alternating electrical field to the exposed chemical amplification resist in a second direction; and a means for holding the substrate so that the heat generated in a first direction flows into the lower surface of the substrate.

Still another embodiment of the invention provides a method of forming a patterned material structure on a substrate, selected from the group consisting of semiconductor, ceramic and metal substrates, the method comprising: optionally providing the substrate surface with an underlayer; applying a positive photoresist composition to the substrate or underlayer-coated substrate to form a photoresist layer; optionally coating the photoresist layer with a protective coating; patternwise exposing the substrate to radiation whereby acid is generated by the radiation-sensitive acid generator in exposed regions of the photoresist layer; subjecting the exposed photoresist layer to postexposure baking while applying an alternating electrical field so as to form a latent, patterned image in the film; contacting the substrate with an aqueous alkaline developer solution, whereby the exposed regions of the photoresist layer are selectively dissolved by the developer solution to reveal a resist structure pattern; and transferring the resist structure pattern to the substrate by etching into the substrate or underlayer-coated substrate through spaces in the resist pattern.

Yet another embodiment of the invention provides a method of forming a patterned material structure on a substrate, selected from the group consisting of semiconductor, ceramic, and metal substrates, the method comprising: optionally providing the substrate surface with an underlayer; applying a negative photoresist composition to the substrate or underlayer-coated substrate to form a photoresist layer; optionally coating the photoresist layer with a protective coating; patternwise exposing the substrate to radiation whereby acid is generated by the radiation-sensitive acid generator in exposed regions of the photoresist layer; subjecting the exposed photoresist layer to postexposure baking while applying an alternating electrical field so as to form a latent, patterned image in the film; contacting the substrate with an aqueous alkaline developer solution, whereby the unexposed regions of the photoresist layer are selectively dissolved by the developer solution to reveal a resist structure pattern; and transferring the resist structure pattern to the substrate by etching into the substrate or underlayer-coated substrate through spaces in the resist structure pattern.

BRIEF DESCRIPTION OF THE DRAWINGS

FIGS. 3($a$) and 3($b$) are photomicrographs of an EFE-PEB resist and a standard PEB resist, respectively, with a 0.5 $\mu$m L/S and a dose of 20 $\mu$C/cm$^2$. FIG. 3($a$) shows a line corner under EFE-PEB with 100 kHz, 3.3V AC at 140° C. for 60 sec. FIG. 3($b$), shows standard PEB at 140° C. for 90 sec. The electrical field was applied in the vertical direction with the negative charge above the resist.

FIGS. 4($a$) and 4($b$) are photomicrographs of an EFE-PEB resist and a standard PEB resist, respectively, with a 0.1 $\mu$m L/S and a dose of 9 $\mu$C/cm$^2$. FIG. 4($a$) is EFE-PEB with 8 kHz, 10 V AC at 140° C. for 90 sec. FIG. 4($b$) shows the results of standard PEB at 140° C. for 90 sec. The electrical field was applied in the vertical direction with the negative charge above the resist.

FIGS. 5($a$) and 5($b$) are photomicrographs of an EFE-PEB resist and a standard PEB resist, respectively, with a 0.2 $\mu$m L/S and a dose of 9 $\mu$C/cm$^2$. FIG. 5($a$) is EFE-PEB with 8 kHz, 10 V AC, at 140° C. for 90 sec. FIG. 5($b$), shows standard PEB at 140° C. for 90 sec. The electrical field was applied in the vertical direction with the negative charge above the resist.

FIGS. 6($a$) and 6($b$) are photomicrographs of an EFE-PEB resist and a standard PEB resist, respectively, with a 0.3 $\mu$m L/S and a dose of 9 $\mu$C/cm$^2$. FIG. 6($a$) is EFE-PEB with 8 kHz, 10 V AC, at 140° C. for 90 sec. FIG. 6($b$), shows standard PEB at 140° C. for 90 sec. The electrical field was applied in the vertical direction with the negative charge above the resist.

FIGS. 7($a$) and 7($b$) are photomicrographs of an EFE-PEB resist and a standard PEB resist, respectively, with a 0.5 $\mu$m L/S and a dose of 15 $\mu$C/cm$^2$. FIG. 7($a$) is EFE-PEB with 8 kHz, 10 V AC, 140° C., 90 sec. and FIG. 7($b$), is standard PEB at 140° C. for 90 sec. The electrical field was applied in the vertical direction with the negative charge above the resist.

FIGS. 8($a$), 8($b$) and 8($c$) are photomicrographs of a standard PEB resist and two EFE-PEB resists, respectively, with the electric field applied in the upward direction in FIG. 8($b$) and in the downward direction if FIG. 8($c$) for 0.3, 0.2, and 0.1 $\mu$m L/S and a dose 12 $\mu$C/cm$^2$ at 140° C. for 90 sec. FIG. 8($a$) shows a standard PEB. FIG. 8($b$) shows the result of EFE-PEB with 3 Hz, 9.8 V AC, 0.65 V DC, applied vertically in the upward direction and FIG. 8($c$) shows the result of EFE-PEB with 3 Hz, 9.8 V AC, 0.65 V DC, applied vertically in the downward direction.

FIGS. 9($a$), 9($b$) and 9($c$) are photomicrographs of standard PEB and EFE-PEB reisists having a 0.3 $\mu$m L/S and a dose of 9 $\mu$C/cm$^2$ that were heated at 140° C. for 90 sec. FIG. 9($a$) shows a standard PEB having 200 nm critical dimensions. FIG. 9($b$) shows the result of EFE-PEB with 3 Hz, 9.8

V AC, 0.65 V DC, on 200 nm critical dimensions and FIG. 9(c) shows the result of EFE-PEB with 3 Hz, 9.8 V AC, 0.65 V DC, having 300 nm critical dimensions.

DETAILED DESCRIPTION OF THE INVENTION

Overview and Definitions:

Before describing the present invention in detail, it is to be understood that this invention is not limited to specific compositions, components or process steps, as such may vary. It is also to be understood that the terminology used herein is for the purpose of describing particular embodiments only and is not intended to be limiting.

It must be noted that, as used in this specification and the appended claims, the singular forms "a," "an" and "the" include plural referents unless the context clearly dictates otherwise. Thus, for example, reference to "a photoacid generator" includes a combination of two or more photoacid generators that may or may not be the same, a "resist binder" includes a mixture of two or more resist binders, and the like.

In describing and claiming the present invention, the following terminology will be used in accordance with the definitions set out below.

"Optional" or "optionally" means that the subsequently described event or circumstance may or may not occur, and that the description includes instances where said event or circumstance occurs and instances where it does not. For example, the phrase "optionally coated" means that a substrate or film may or may not be coated and that the description includes both uncoated and coated films and substrates.

The term "resist binder" is used to refer to a chemical compound that is suitable for use in a positive or negative photoresist, i.e., for use in negative resist applications, the compound must be rendered developer-insoluble by photoacid-activated crosslinking, and for positive resists, the compound must be rendered developer soluble by cleavage of solubility blocking moieties from the compound by the photoacid.

The term "applied vertically in an upward direction" refers to an arrangement of the electrical field that draws the photoacid toward the upper surface of the resist, i.e, wherein the negatively charged end of the electrical field is placed above the resist.

The term "applied vertically in an downward direction" refers to an arrangement of the electrical field that draws the photoacid toward the lower surface of the resist, i.e, wherein the negatively charged end of the electrical field is placed below the resist.

The terms "photogenerated acid" and "photoacid" are used interchangeably herein to refer to the acid that is created upon exposure of the present compositions to radiation, i.e., as a result of the radiation-sensitive acid generator in the compositions.

For additional information concerning terms used in the field of lithography and lithographic compositions, reference may be had to Introduction to Microlithography, Eds. Thompson et al. (Washington, D.C.: American Chemical Society, 1994).

Post Exposure Bake Model:

According to the present invention, an alternating electric field is applied across the resist film so that the direction of the field is parallel to the desired direction of photoacid drift, e.g. vertically across the resist film, during the PEB. As discussed by M. Zuniga et al. (1996) *Proc. SPIE*, 2724:, post exposure bake processes can be described via the following two partial differential equations (1) and (2)

$$\frac{\partial C_{as}}{\partial t} = K_1(1 - C_{as})C_a \quad (1)$$

$$\frac{\partial C_a}{\partial t} = \nabla(D\nabla C_a) - \nabla(\mu E C_a) + K_2 C_a \quad (2)$$

Equation (1) describes the acid-catalyzed deprotection reaction wherein $K_1$ is the reaction rate coefficient, and m is a constant, $C_{as}$ is the activated site concentration, defined as the percent of blocking groups that have been deblocked, and $C_a$ is the acid concentration.

Equation (2) describes the acid diffusion, loss and drift in the presence of an electric field. The first term is the acid diffusion term, wherein D is the diffusivity. The second term is the acid drift term, where $\mu$ is the acid mobility and E is the electric field in the resist. The third term is the acid loss term, where $K_2$ is the acid loss rate. The acid mobility, $\mu$, is related to acid diffusivity, D, by the Einstein equation (3):

$$\mu = \frac{qD}{kT} \quad (3)$$

wherein q is the charge of the acid.

Figure 1:
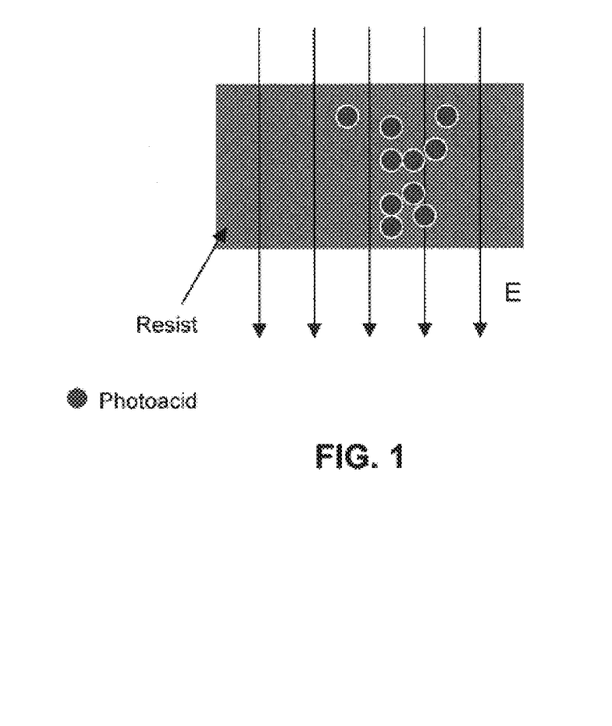
FIG. 1 schematically illustrates the principal of electric-field-enhanced postexposure bake using the method of the invention. The acid drift along the direction of the applied electric field is enhanced by the electric field with peak voltage V/–V and an optional constant voltage offset (DC), with period T.

To improve the resist profile, it is desired, in one embodiment, to enhance the acid drift in the vertical direction and reduce the acid diffusion in the horizontal direction. Hence, the electric field is applied along the vertical direction, as is illustrated in FIG. 1.

For the sake of simplicity, the one-dimensional form of equations (1) and (2) may be solved as shown below. That is, assuming that E is at the vertical direction and the acid diffuses and drifts only in the vertical direction, equations (1) and (2) become equations (4) and (5):

$$\frac{\partial C_{as}}{\partial t} = K_1(1 - C_{as})C_a \quad (4)$$

$$\frac{\partial C_a}{\partial t} = \frac{\partial}{\partial x}\left(D\frac{\partial C_a}{\partial x}\right) - \frac{\partial}{\partial x}(\mu E C_a) + K_2 C_a \quad (5)$$

Substituting for $\mu$ in (5), assuming for the sake of simplicity that D is constant (i.e., Fickean diffusion), and that E is uniform, then (5) becomes:

$$\frac{\partial C_a}{\partial t} = D\frac{\partial^2 C_a}{\partial x^2} - \frac{qED}{kT}\frac{\partial C_a}{\partial x} - K_2 C_a \quad (6)$$

with boundary conditions (7):

$$-D\frac{\partial C_a}{\partial t} + \frac{qED}{kT}C_a = 0, \text{ at } x = 0, L \quad (7)$$

$$Ca(x,0) = C(x)$$

wherein L is the thickness of the resist film. Equation (6) requires the total flux, due to both diffusion and drift, to be zero at the top and bottom of the resist film. It is assumed that acid does not evaporate at the surface and cannot diffuse into the silicon substrate. C(x) is the initial profile of the acid concentration vs. depth formed by exposure.

It can be shown that the solution to equations (6) and (7) is equation (8):

$$C_a(x, t) = \sum_{m=0}^{\infty} A_m e^{\frac{qE}{2kT}x} \left( e^{-\frac{jm\pi x}{L}} + p_m e^{\frac{jm\pi x}{L}} \right) e^{-\left(\frac{m^2\pi^2 D}{L^2} + \frac{q^2E^2D}{4k^2T^2} + K_2\right)t} \quad (8)$$

$$p_m = \frac{j\frac{m\pi}{L} - \frac{qE}{kT}}{j\frac{m\pi}{L} + \frac{qE}{kT}}$$

where
and where $A_m$, m=0, 1, . . . are the orthogonal expansion coefficients given by:

$$A_m = \frac{1}{2L} \int_0^L C_a(x, 0) e^{-\frac{qE}{2kT}x} \left( e^{-\frac{jm\pi x}{L}} + \frac{1}{p_m} e^{\frac{jm\pi x}{L}} \right) dx \quad (9)$$

Note that the solution of equations (8) and (9) converges everywhere except at x=0, L. From equations (8) and (9), the solution to (4) can be obtained (4a):

$$C_{as}(x, t) = 1 - e^{-K_1 \int_0^t C_a^m(x,\tau) d\tau}.$$

Assuming L is large enough, the vertical drift/diffusion length in time t, $s_v$, is estimated by equation (10)

$$s_v = \frac{qED}{kT}t + \sqrt{2Dt}. \quad (10)$$

The vertical "drift/diffusion length" is a linear combination of drift and diffusion length. Assuming the lateral diffusion is independent of vertical transportation, the lateral diffusion length, $s_1$, is given by $$s_1 = \sqrt{2Dt}. \quad (11)$$

Even though the lateral diffusion length is not affected by the electric field, the lateral deprotection is reduced as the acid preferentially moves a greater length in the vertical direction and enters into deprotection reactions along this path. This allows the bake time to be reduced and thereby reduces lateral diffusion. In addition, in the exposed area there is a sufficient concentration of acid to create many deprotection reactions and open up additional diffusion pathways. This increase in diffusion combined with the increase in the concentration of deprotection reactions further accelerates the acid movement in response to the electric field making the treatment even more locally effective. This positive feedback gives the enhancement nonlinear growth and makes its effectiveness larger than that expected from the reduction in bake time as described by the above analysis in which concentration independent diffusion (Fickean) was assumed.

It is desired to maximize the vertical drift and diffusion length, $s_v$, and minimize the lateral diffusion length, $s_1$. Thus, as may be deduced from equations (10) and (11), a large applied electric field, E, and a short PEB time are desired. To enhance vertical deprotection and reduce lateral deprotection by transporting acid, an alternating electric field with an offset bias is preferred. In selecting the frequency and offset bias, two criteria must be satisfied. First, the frequency should be low enough for the offset bias to vertically move acid in an unexposed region for a sufficient distance before the acid fully deprotects the polymer in that region. Thus, the frequency should be high enough for the acid in the exposed region to fully deprotect the polymer. So the frequency and offset bias should be adjusted based on acid diffusivity and concentration in each of the exposed and unexposed regions.

The applied voltage will generally be in the range of from about 3V to about 20V and will preferably range from about 8V to about 12V. The frequency will generally range from about 1 Hz to about 1 kHz and will more commonly range from about 3 Hz to about 10 Hz. The offset bias may range from 0% of the applied voltage to about 75% of the applied voltage, preferably from about 5% to about 60% of the applied voltage. The exact bias used will depend upon the type of radiation and resist selected. Excessively large offset biases should be avoided as the use of such biases may drive the photoacid to the upper surface of the resist before the blocked groups are removed, in a positive resist or the crosslinking agents have crosslinked the resist components in a negative resist. The waveform of the applied voltage is not critical and sine or square waveforms are acceptable.

Figure 2:
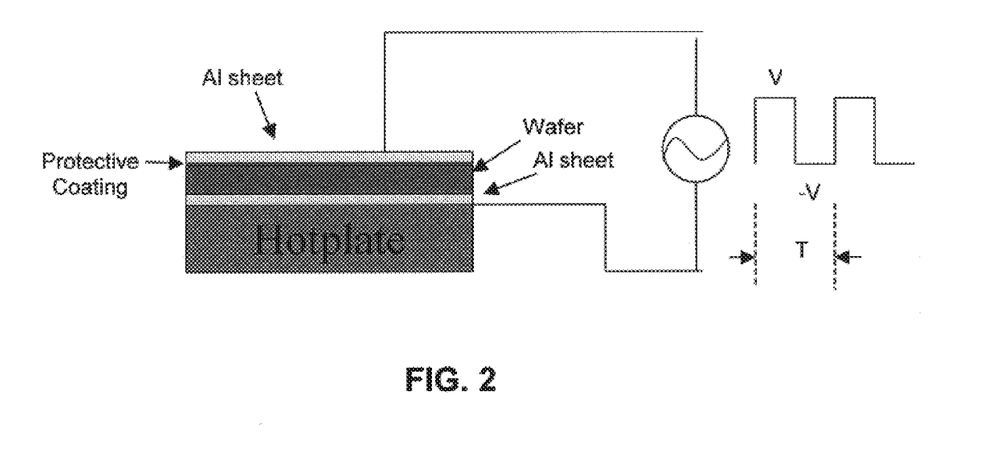
FIG. 2 schematically illustrates one embodiment of an apparatus for conducting electric-field-enhanced (EFE) PEB. The wafer is placed between two Al sheets. The waveform of the output voltage is shown as a bi-polar rectangular wave with peak voltage V/–V and period T.
Figure 3A:
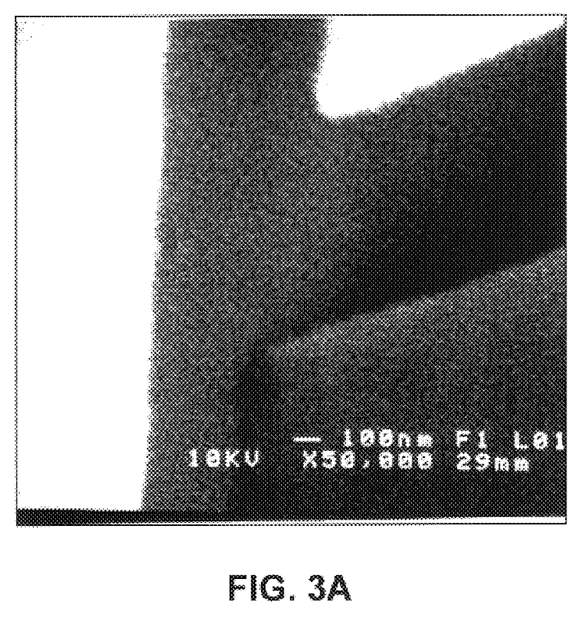
Figure 3B:
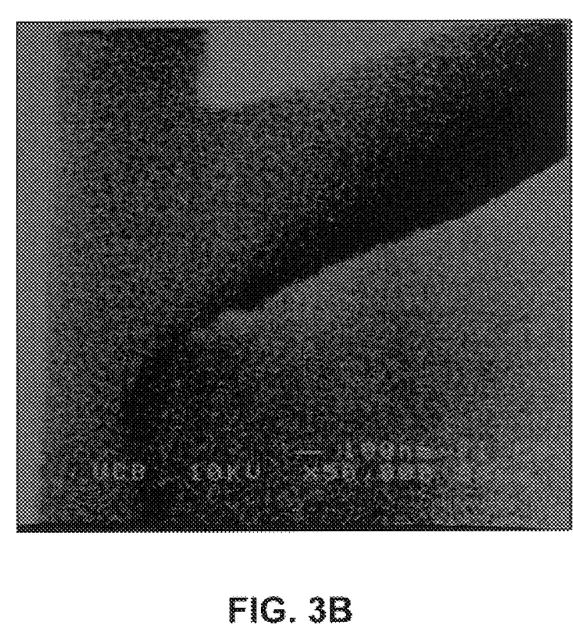
Figure 4A:
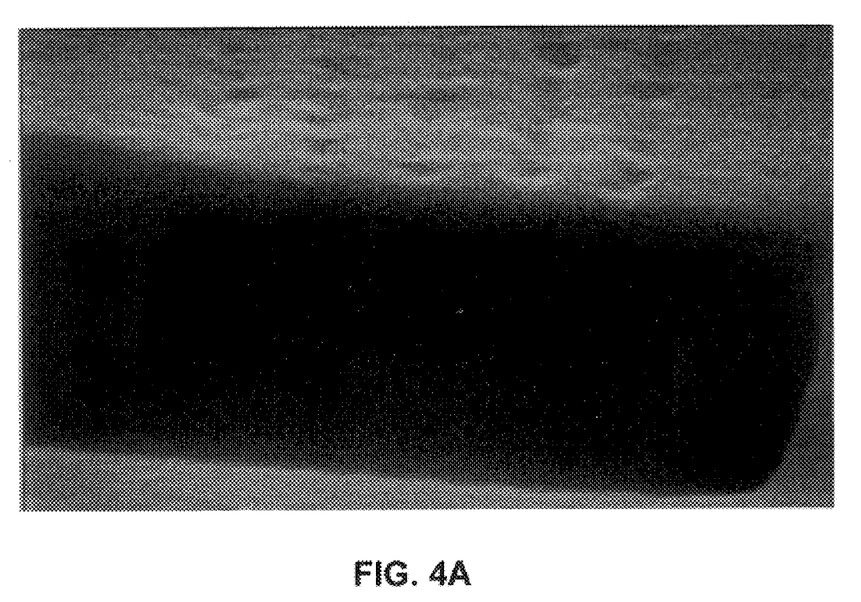
Figure 4B:
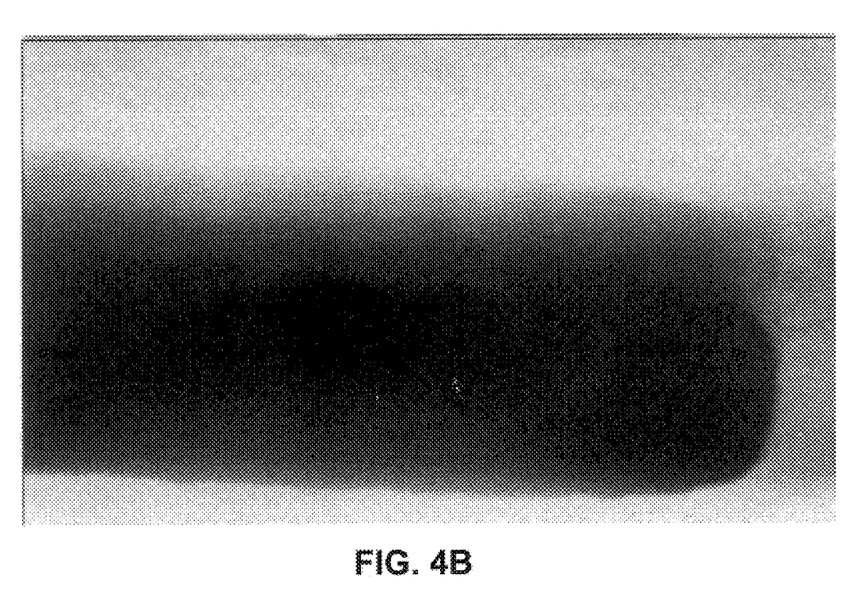
Figure 5A:
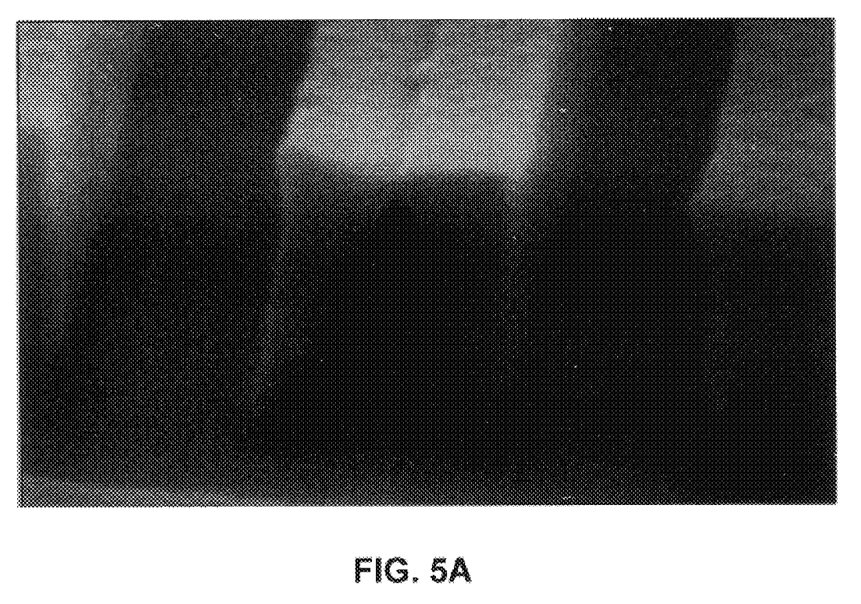
Figure 5B:
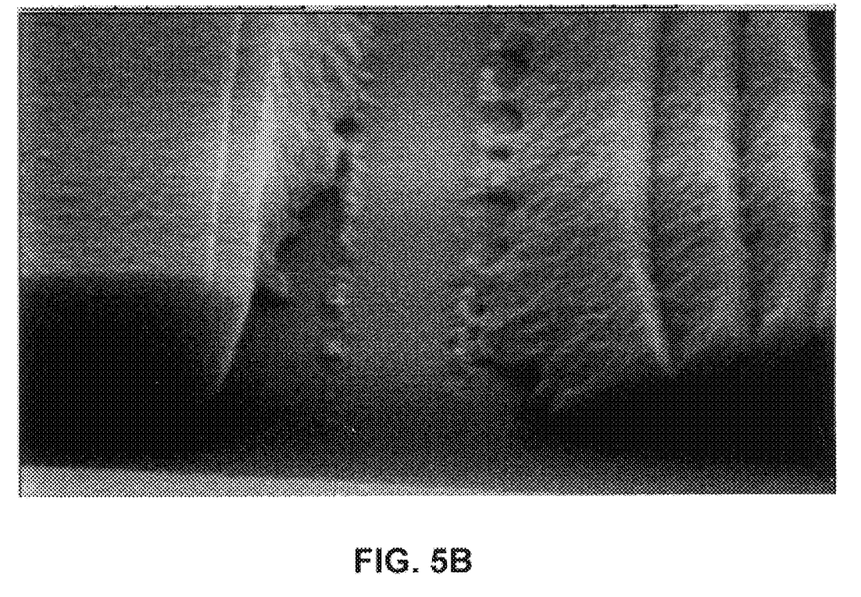
Figure 6A:
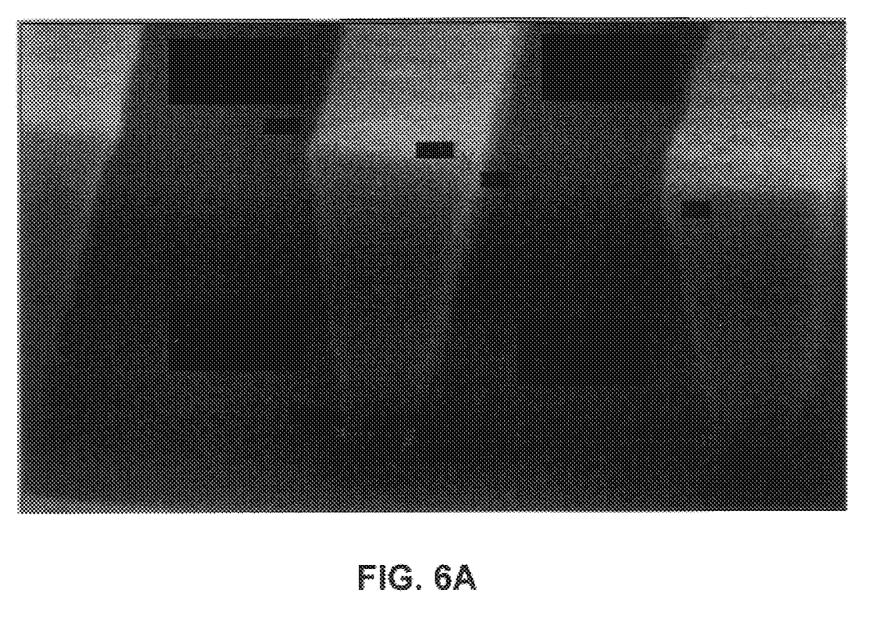
Figure 6B:
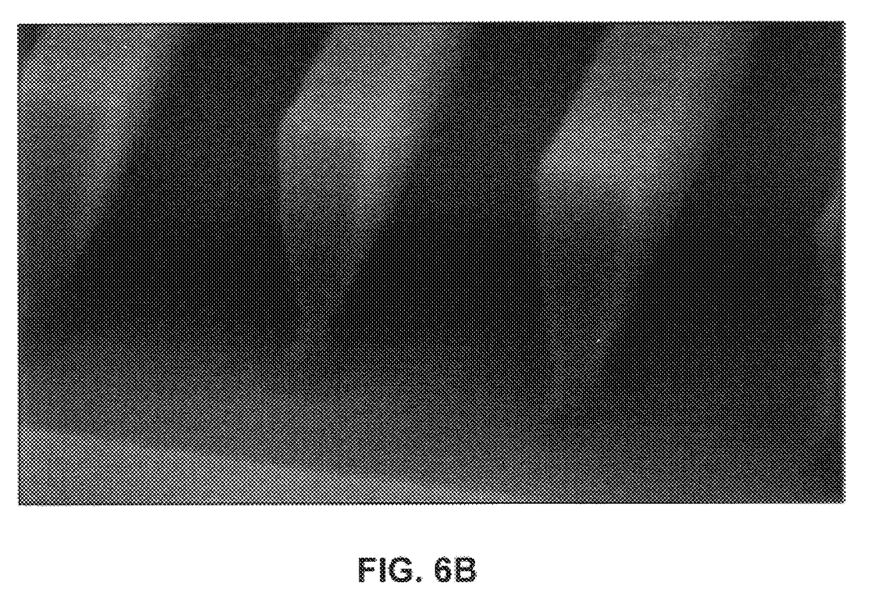
Figure 7A:
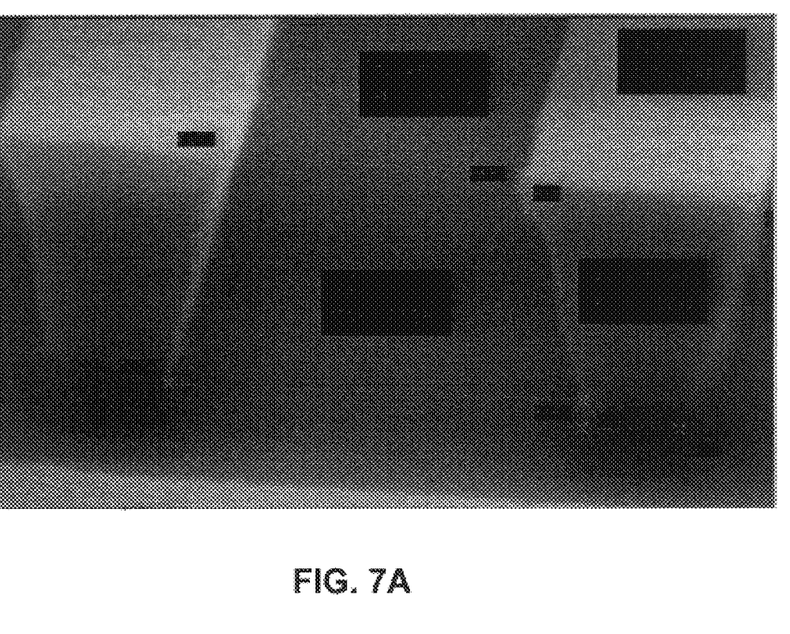
Figure 7B:
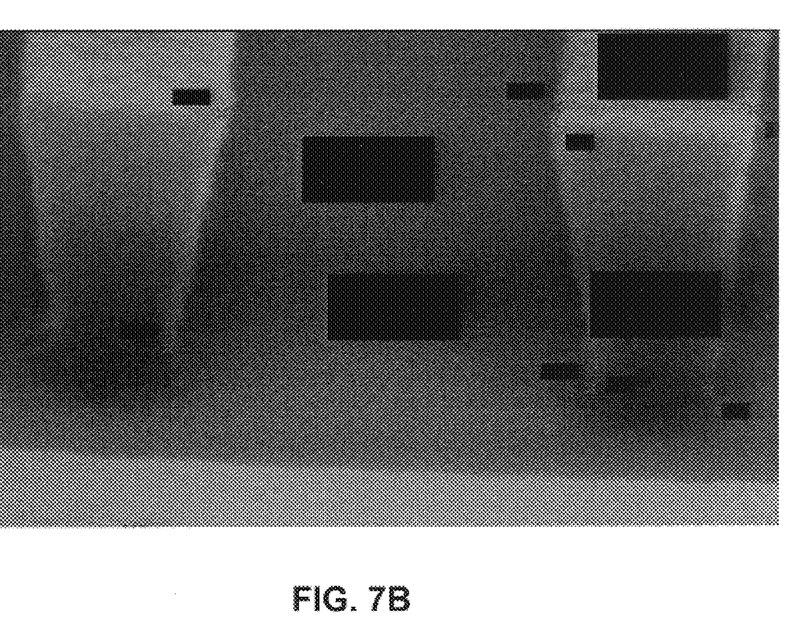

One embodiment of an electric-field-enhanced PEB apparatus and a voltage waveform is shown in FIG. 2. In this embodiment, an exposed chemical amplification resist, located on the upper surface of a wafer substrate, is placed between two metal plates (e.g., aluminum plates) that are electrically connected to a power source capable of producing an alternating electrical field. The surface of the upper metal plate that contacts the exposed photoresist is coated with a non-reactive polymer to prevent reaction of the metal with the photoacid within the photoresist. Alternatively, the surface of the photoresist may itself be coated to prevent acid-metal electrode interaction.

It will be apparent to one of skill in the art that the means for applying the electrical field need not be limited to aluminum plates. Other electrode materials are well known in the art and the selection, shape, and size of the electrode will depend on the characteristics of the photoresist being processed. Similarly, the electrical field need not be applied vertically across the resist. In situations where it is desired to influence the movement of the acid preferentially in the horizontal direction, the current may be applied horizontally to the surface of the resist and the electric field used to deblock or crosslink horizontal areas of the resist.

The means for applying the electric field may also be located within the body of the resist, e.g., as a conductive layers formed over the resist or conductive regions in one or more additional photoresist layers. Also, the electric field need not be applied to the resist as a whole and may be selectively applied to different areas of the resist, either vertically or horizontally, at different times, using either an external field source or an internal field source. Thus, for example, by sequentially adding and exposing layers of resist and then subjecting the final resist to electric field enhanced postexposure baking, cantilevered structures may be fabricated.

Generally, the electrodes and the substrate are then place on a heat source. The resist is then heated while electrical current is applied. It should be noted that the postexposure baking may be conducted in a vacuum or in an inert atmosphere so as to mitigate the effects of airborne contamination. Also, it should be noted that the applied alternating electrical field will also serve to influence photoacid diffusion without the application of heat and is, therefore, suitable for resists systems that utilize a non-thermal chemical amplification system.

The Resist Binder:

The present method is suitable for use with any conventionally used chemically amplified photoresist. The effect of the applied electrical field is wholly dependent on the presence of photogenerated acid and the particular resist binder or radiation acid generator are not significant. One of skill in the art will appreciate that there are any number of suitable resist binders that may be used. Suitable binders include acrylates, such as Novolac resins, poly (methylmethacrylates), and poly(olefin sulfones) such poly (butene-1-sulfone). Novolac resins are the thermoplastic condensation products of a phenol and an aldehyde. Examples of suitable phenols for condensation with an aldehyde, particularly, although not necessarily, formaldehyde, are phenol, m-cresol, o-cresol, p-cresol, 2,4-xylenol, 2,5-xylenol, 3,4-xylenol, 3,5-xylenol and thymol. Preferred Novolac resins for use herein are the cresol formaldehyde condensation products. Other inert polymers include, for example, homopolymers or copolymers of vinylphenols. Polymers with ester functionalities that undergo acidolysis are also useful herein, e.g., poly(4-vinylbenzoates), polymethacrylates, and the like.

Still other resist binders are copolymers. Suitable copolymers include, but are not limited to, copolymers comprising a combination of two or more of the following: phenolic monomer units, i.e., substituted or unsubstituted vinylphenols; acrylate monomer units, e.g., substituted or unsubstituted acrylic acid, methacrylic acid, or the like; and styrene monomer units, typically substituted or unsubstituted hydroxystyrene. If substituents are present on any of the foregoing, they must not interfere with the lithographic utility of the polymer. Suitable substituents thus include the halogens, lower alkyl such as methyl or ethyl, and lower alkoxy such as methoxy or ethoxy. Specific examples of suitable copolymers are as follows: an alternating copolymer of $\alpha,\alpha$-dimethylbenzyl methacrylate with $\alpha$-methylstyrene; a block copolymer of benzyl methacrylate with tetrahydropyranyl methacrylate; and a terpolymer of either of the foregoing with 4-acetoxystyrene. Other suitable resist binders will be known to those skilled in the art or described in the pertinent literature. See, e.g., Ito, "Functional Polymers for Microlithography: Chemically Amplified Imaging Systems," in the *ACS Desk Reference of Functional Polymers* (1997).

The Photoacid Generator:

The second component of the photoresist composition is a photoacid generator (PAG). Upon exposure to radiation, the photoacid generator generates a strong acid. A variety of photoacid generators can be used in the composition of the present invention. Generally, suitable acid generators have a high thermal stability (preferably to temperatures greater than 140° C.) so they are not degraded during pre-exposure processing. Generally, sulfonate compounds are preferred PAGs, particularly sulfonate salts, but other suitable sulfonate PAGs include sulfonated esters and sulfonyloxy ketones. See U.S. Pat. No. 5,344,742 to Sinta et al., and (1991), *J. Photopolymer Science and Technology* 4:337–340, for disclosure of suitable sulfonate PAGs, including benzoin tosylate, t-butylphenyl $\alpha$-(p-toluenesulfonyloxy)-acetate and t-butyl $\alpha$-(p-toluenesulfonyloxy)-acetate.

Onium salts are also generally preferred acid generators of compositions of the invention. Onium salts that are weakly nucleophilic anions have been found to be particularly suitable. Examples of such anions are the halogen complex anions of divalent to heptavalent metals or non-metals, for example, Sb, B, P, and As. Examples of suitable onium salts are aryl-diazonium salts, halonium salts, aromatic sulfonium salts and sulfoxonium salts or selenium salts (e.g., triarylsulfonium and diaryliodonium hexafluoroantimonates, hexafluoroarsenates, trifluoromethanesulfonates and others). Examples of suitable preferred onium salts can be found in U.S. Pat. Nos. 4,442,197, 4,603,101, and 4,624,912.

Other useful acid generators include nitrobenzyl esters and the s-triazine derivatives. Suitable s-triazine acid generators are disclosed, for example, in U.S. Pat. No. 4,189,323.

Still other suitable acid generators include N-camphorsulfonyloxynaphthalimide, N-pentafluorophenylsulfonyloxynaphthalimide, ionic iodonium sulfonates, e.g., diaryl iodonium (alkyl or aryl) sulfonate and bis-(di-t-butylphenyl)iodonium camphanylsulfonate, perfluoroalkanesulfonates, such as perfluoropentanesulfonate, perfluorooctanesulfonate, and perfluoromethanesulfonate; aryl (e.g., phenyl or benzyl) triflates and derivatives and analogs thereof, e.g., triphenylsulfonium triflate or bis-(t-butylphenyl)iodonium triflate; pyrogallol derivatives (e.g., trimesylate of pyrogallol); trifluoromethanesulfonate esters of hydroxyimides, $\alpha,\alpha'$-bis-sulfonyl-diazomethanes; sulfonate esters of nitro-substituted benzyl alcohols; naphthoquinone-4-diazides; and alkyl disulfones. Other suitable photoacid generators are disclosed in Reichmanis et al. (1991) *Chemistry of Materials* 3:395, and in U.S. Pat. No. 5,679,495 to Yamachika et al. Additional suitable acid generators useful in conjunction with the methods of the invention will be known to those skilled in the art and/or are described in the pertinent literature.

The Photoresist Composition:

The photoresist composition herein comprises both a resist binder and a photoacid generator, as described in detail above. The photoresist may be a negative or a positive photoresist and other components and additives may also be present. The photoresist composition will usually be a chemically amplified photoresist. However, the present method will also work in non-amplification resist systems that utilize a photoacid so long as there is a sufficient delay between the exposure and the deblocking or crosslinking activity of the photoacid.

If the photoresist is a positive photoresist, the composition may include a monomeric or polymeric acid-cleavable dissolution inhibitor. When patternwise exposed to a radiation source, the acid generated by the radiation-sensitive acid generator will cleave the acid-cleavable moieties in the resist binder and/or in the dissolution inhibitor, thus making the exposed areas of the photoresist composition soluble in conventional developer solutions.

Suitable dissolution inhibitors will be known to those skilled in the art and/or described in the pertinent literature. Preferred dissolution inhibitors have high solubility in the resist composition and the solvent used to prepare solutions of the resist composition (e.g., propylene glycol methyl ether acetate, or "PGMEA"), exhibit strong dissolution inhibition, have a high exposed dissolution rate, are transparent at the wavelength of interest, exhibit a moderating influence on Tg, strong etch resistance, and display good thermal stability (i.e., stability at temperatures of about 140° C. or greater). Both polymeric and monomeric dissolution inhibitors may be used in the photoresist composition of the invention.

Suitable dissolution inhibitors include, but are not limited to, bisphenol A derivatives and carbonate derivatives wherein the hydroxyl group of bisphenol A is replaced by tert-butyl derivative substituents such as tert-butyloxy, tert-butyloxycarbonyl, and tert-butyloxycarbonyl-methyl groups; fluorinated bisphenol A derivatives such as $CF_3$-Bis-A/tBuOCOCH$_3$ (6F-Bisphenol A protected with a t-butoxycarbonylmethyl group); normal or branched chain acetal groups such as 1-ethoxyethyl, 1-propoxyethyl, 1-n- butoxyethyl, 1-isobutoxy-ethyl, 1-tert-butyloxyethyl, and 1-tert-amyloxyethyl groups; and cyclic acetal groups such as tetrahydrofuranyl, tetrahydropyranyl, and 2-methoxytetrahydropyranyl groups; androstane-17-alkylcarboxylates and analogs thereof, wherein the 17-alkylcarboxylate at the 17-position is typically lower alkyl. Examples of such compounds include lower alkyl esters of cholic, ursocholic and lithocholic acid, including methyl cholate, methyl lithocholate, methyl ursocholate, t-butyl cholate, t-butyl lithocholate, t-butyl ursocholate, and the like; hydroxyl-substituted analogs of such compounds (ibid.); and androstane-17-alkylcarboxylates substituted with 1 to 3 $C_1$–$C_4$ fluoroalkyl carbonyloxy substituents, such as t-butyl trifluoroacetyllithocholate (see, e.g., U.S. Pat. No. 5,580,694 to Allen et al.).

If the photoresist composition is a negative photoresist, the composition will include a crosslinking agent. When exposed to radiation, the acid produced by the radiation-sensitive acid generator in the exposed areas will cause the crosslinking agent to react with the polymers of the invention, thus making the exposed regions insoluble in developer solution. Dissolution inhibitors are not included in negative photoresists nor are crosslinking agents included in positive photoresist.

Use in Generation of Resist Images on a Substrate:

The present invention also relates to a process for generating a resist image on a substrate comprising the steps of: (a) coating a substrate with a film comprising the resist composition of the present invention; (b) imagewise exposing the film to radiation; and (c) developing the image. The first step involves coating the substrate with a film comprising the resist composition dissolved in a suitable solvent. Suitable substrates are ceramic, metallic or semiconductive, and preferred substrates are silicon-containing, including, for example, silicon dioxide, silicon nitride, and silicon oxynitride. The substrate may or may not be coated with an organic anti-reflective layer prior to deposition of the resist composition. Alternatively, a bilayer substrate may be employed wherein a resist composition of the invention forms an upper resist layer (i.e., the imaging layer) on top of a bilayer substrate comprised of a base layer and underlayer that lies between the upper resist layer and the base layer. The base layer of the bilayer substrate is comprised of a suitable substrate material, and the underlayer of the bilayer substrate is comprised of a material that is highly absorbing at the imaging wavelength and compatible with the imaging layer. Conventional underlayers include cross-linked poly (hydroxystyrene), polyesters, polyacrylates, fluorinated polymers, cyclic-olefin polymers and the like, including diazonapthoquinone (DNQ)/Novolak resist material.

Preferably, the surface of the coated or uncoated, single or bilayer substrate is cleaned by standard procedures before the film is deposited thereon. Suitable solvents for the composition are as described in the preceding section, and include, for example, cyclohexanone, ethyl lactate, and propylene glycol methyl ether acetate. The film can be coated on the substrate using art-known techniques known in the art, such as spin or spray coating, or doctor blading. Preferably, before the film has been exposed to radiation, the film is heated to an elevated temperature of about 90–160° C. for a short period of time, typically on the order of about 1 minute. The dried film has a thickness of about 0.01 to about 5.0 microns.

In the second step of the process, the film is imagewise exposed to radiation, i.e., UV, X-ray, electron beam, or the like. If ultraviolet radiation is used, ultraviolet radiation having a wavelength of about 248 nm, 193 nm, or about 157 nm is preferred. Suitable radiation sources include mercury, mercury/xenon, and xenon lamps. Conveniently, due to the enhanced radiation sensitivity of the photoresist composition, full exposure of the photoresist composition is achieved with less than about 100 mJ/cm$^2$ of radiation, more preferably with less than about 50 mJ/cm$^2$ of radiation. If electron beam radiation is used, full exposure of the photoresist composition is achieved with less than about 25 $\mu$C/cm$^2$, generally ranging in the area of between 6 $\mu$C/cm$^2$ and about 20 $\mu$C/cm$^2$ with exposure between 9 $\mu$C/cm$^2$ and about 15 $\mu$C/cm$^2$ most preferred. The exact exposure required will, of coarse, be highly dependent on the radiation source and the resist materials.

Other potential exposure sources include, but are not limited to, conventional projection or contact/proximity printing with wavelengths such as arc lamp lines (436, 407, 365, etc. and its continuum and laser sources (such as 248, 193, 157, etc.); extreme ultraviolet radiation (EUV) (13.4 nm, 11+nm, etc.) and other x-ray point sources, synchrotron and undulator sources; particle beam sources such as electrons and ions; and exposure methods associated with emerging maskless lithography techniques (such as scanning probes with optical, electrical, thermal, and mechanical effects). The trend toward lithographic methods wherein the exposure does not penetrate throughout a resist layer renders the method described herein increasingly significant. For a review of trends in current photoresist technology see, Conley et al. (1996) *Semi. Fab. Tech.* 5:201–219 and Pawlowski et al. (1997) *Semi. Fab. Tech.* 6:215–224.

The radiation is absorbed by the radiation-sensitive acid generator to generate free acid. In positive photoresists, with heating and application of the alternating electrical field, the free acid causes cleavage of the acid-cleavable blocking groups that are present in the exposed areas of the photoresist. In negative photoresists, the free acid causes the crosslinking agents to react with the resin binder, thereby forming insoluble crosslinked areas of photoresist. Generally, during the PEB step of image development the photoresist composition is heated to an elevated temperature of about 90–150° C. for a short period of time, on the order of from about 30 seconds to about 120 seconds, optimally about 90 seconds. It is significant that the present method allows for a reduction in the amount of time required for PEB of as much as about two-thirds of standard PEB time.

The third step involves development of the image with a suitable solvent. Suitable solvents include an aqueous base, preferably an aqueous base without metal ions such as the industry standard developer tetramethylammonium hydroxide or choline. In positive photoresist applications, the exposed areas of the photoresist will be soluble, leaving behind the unexposed areas. In negative photoresist, the converse is true, i.e., the unexposed regions will be soluble to the developer while the exposed regions will remain.

The pattern from the resist structure may then be transferred to the material of the underlying substrate. In coated or bilayer photoresists, this will involve transferring the pattern through and coating that may be present and through the underlayer onto the base layer. In single layer photoresists the transfer will be made directly to the substrate. Typically, the pattern is transferred by etching with reactive ions such as oxygen, plasma, and/or oxygen/sulfur dioxide plasma. Suitable plasma tools include, but are not limited to, electron cyclotron resonance (ECR), helicon, inductively coupled plasma (ICP) and transmission-coupled plasma (TCP) system. Etching techniques are well known in the art and one skilled in the art will be familiar with the suitable commercially available etching equipment.

Thus, the method and apparatus of the invention can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

Other Uses:

The present invention may also be used without exposure of the resist to enhance movement of species associated with material treatments (such as drift and diffusion of one material into or out of another). Alternatively, the invention may be used to delay the triggering of a process that alters a particular material until intermediate steps have been completed (i.e, by depositing and patterning additional materials followed by application of the treatment to modify an underlying and inaccessible layer.) The disclosed method may also be used to selectively process areas differently on a wafer by applying the electrical field enhancement selectively.

It is to be understood that, while the invention has been described in conjunction with the preferred specific embodiments thereof, the foregoing description as well as the examples that follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entirety.

EXPERIMENTAL

The following examples are put forth so as to provide those of ordinary skill in the art with a complete disclosure and description of how to prepare and use the compositions disclosed and claimed herein. Efforts have been made to ensure accuracy with respect to numbers (e.g., amounts, temperature, etc.) but some errors and deviations should be accounted for. Unless indicated otherwise, parts are parts by weight, temperature is in deg. C. and pressure is at or near atmospheric. Additionally, all starting materials were obtained commercially or synthesized using known procedures.

The experiments were conducted on a JEOL electron-beam exposure tool. The UVIIHS resist was coated onto highly-doped wafers (the resistance is <10 W, hence the voltage drop across the substrate can be ignored) at 3000 rpm for 30 sec and prebaked at 140° C. for 60 sec. The exposure doses were 1.5, 3, 6, 9, 15, 20, 30 mC/cm$^2$ with beam currents 1, 5 and 10 pA. The patterns of equal line/space (L/S) were exposed, the line/space widths were 100 nm, 200 nm, 300 nm and 500 nm, i.e., L/S=100/100, 200/200, 300/300, 500/500 nm. To exclude environmental variation, two chips were loaded into the exposure tool at the same time. Even though e-beam exposure is conducted in a sequential manner, the second chip was exposed within 20 min after first chip exposure and all exposures were conducted more than 2 hrs after tuning the exposure tool, in order to minimize beam current drift. The two chips were exposed with the same dose/beam current matrix.

One or two chips were randomly chosen for EFE-PEB and the one chip chosen for standard PEB. The standard PEB conditions are: 140° C., 90 sec. Three sets of EFE-PEB conditions were used:

(1) 140° C., frequency 100 kHz, 3.3V, 60 sec, i.e., high-frequency, low-voltage;

(2) 140° C., frequency 8 kHz, 10V, 90 sec, i.e., low-frequency, high-voltage; and (3) 140° C., frequency 3 Hz, 9.8V, 90 sec, i.e., very low-frequency, high-voltage.

The chips were developed in 0.263N tetramethylammoniumhydroxide (TMAH) for 60 sec, in room temperature.

The 2-chip experiment was repeated 6 times and had good reproducibility as did the three chip experiment.

Experimental Results and Analysis:

In general, scanning electro microscope (SEM) images show T-topping taking place to some extent; see FIGS. 3–7. This T-topping might be caused by several mechanisms. The samples were exposed in vacuum, as some chemicals may outgas during the pumping process and cause surface retardation. The highest electron dose is close to the substrate, as the top part of the resist is exposed mainly by electron back scattering and may not receive enough dose. Environmental contamination may exist in the SEM area.

Example 1

Electrical Field Enhanced-Postexposure Bake (EFE-PEB) vs. Standard Postexposure Bake (PEB): Corner and PEB Time Comparison Two samples were pattern-wise exposed to electron beam radiation. The line/space width of the exposed pattern was 500 nm, and the exposure dose was 20 $\mu$C/cm$^2$. During PEB, one sample, shown in FIG. 3(a), was the subjected to a 100 kHz alternating 3.3V electric field and heated at 140° C. for 60 sec. The other sample, shown in FIG. 3(b), was subjected to standard PEB at 140° C. for 90 sec. It can be seen by comparing FIGS. 3(a) and (b) that in the resist processed with an electric field, the corner has a vertical edge, while in the resist made using standard PEB, the corner has a large radius profile with a rough edge that gradually tapers down to the substrate.

Example 2

EFE-PEB vs. Standard PEB: Cross-Section Comparison

Two samples were pattern-wise exposed to electron beam radiation. The line/space width of the exposed pattern was 0.1 $\mu$m, and the exposure dose was 9 $\mu$C/cm$^2$. During PEB, one sample, shown in FIG. 4(a), was the subjected to a 8 kHz alternating 10V electric field and heated at 140° C. for 90 sec. The other sample, shown in FIG. 4(b), was subjected to standard PEB at 140° C. for 90 sec. It can be seen by comparing FIGS. 4(a) and (b) that in the resist processed without an electric field, the T-top effect was so severe that the top of the resist remained while the lower part of resist was washed away, and in the resist made with an applied electrical field, the electrical field confined the effects of the lateral acid diffusion so more resist on top remained and formed a "comb." In the standard PEB, the teeth of the "comb" were deprotected and developed due to lateral acid diffusion.

Example 3

EFE-PEB vs. Standard PEB: Cross-Section Comparison

Two samples were pattern-wise exposed to electron beam radiation. The line/space width of the exposed pattern was 0.2 $\mu$m, and the exposure dose was 9 $\mu$C/cm$^2$. During PEB, one sample, shown in FIG. 5(a), was the subjected to a 8 kHz alternating 10 V electric field and heated at 140° C. for 90 sec. The other sample, shown in FIG. 5(b), was subjected to standard PEB at 140° C. for 90 sec. It can be seen by comparing FIGS. 5(a) and (b) that the standard PEB resulted in a very narrow resist foot which causes the collapse of resist lines, while in the resist made with an applied electrical field, the electrical field led to a thicker foot which was able to sustain the resist lines. This collapsed pattern is an example of over-exposure. The EFE-PEB has better tolerance of over-exposure because it confines acid diffusion and reduces extra lateral deprotection.

Example 4
EFE-PEB vs. Standard PEB: Cross-Section Comparison

Two samples were pattern-wise exposed to electron beam radiation. The line/space width of the exposed pattern was 0.3 μm, and the exposure dose was 9 μC/cm$^2$. During PEB, one sample, shown in FIG. 6(a), was the subjected to a 8 kHz alternating 10 V electric field and heated at 140° C. for 90 sec. The other sample, shown in FIG. 6(b), was subjected to standard PEB at 140° C. for 90 sec. It can be seen that the EFE-PEB led to much better resist profile, although the T-top effect still existed.

Example 5
EFE-PEB vs. Standard PEB: Cross-Section Comparison

Two samples were pattern-wise exposed to electron beam radiation. The line/space width of the exposed pattern was 0.5 μm, and the exposure dose was 15 μC/cm$^2$. During PEB, one sample, shown in FIG. 7(a), was the subjected to a 8 kHz alternating 10 V electric field and heated at 140° C. for 90 sec. The other sample, shown in FIG. 7(b), was subjected to standard PEB at 140° C. for 90 sec. Although the standard PEB and EFE-PEB lead to similar resist profiles, EFE-PEB provided a better critical dimension control. In this sample, the design L/S is 500 nm/500 nm, standard PEB gave L/S=358 nm/600 nm, EFE-PEB gave L/S=430 nm/538 nm. EFE-PEB reduced the lateral deprotection length by about 70 nm.

Figure 8A:
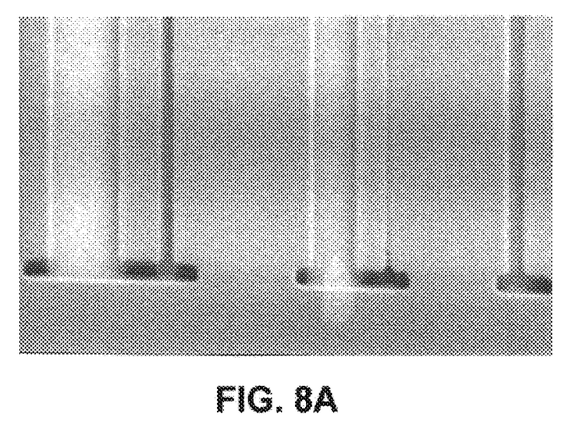
Figure 8B:
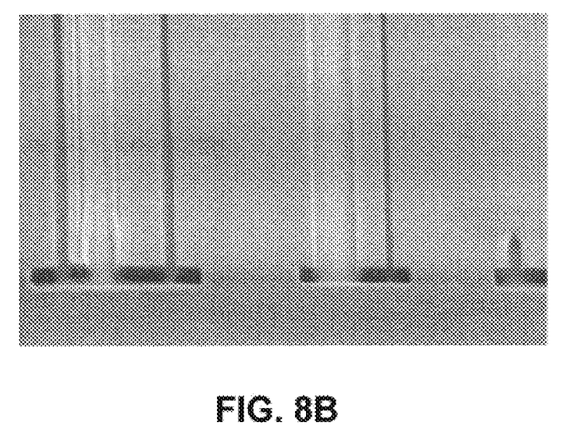
Figure 8C:
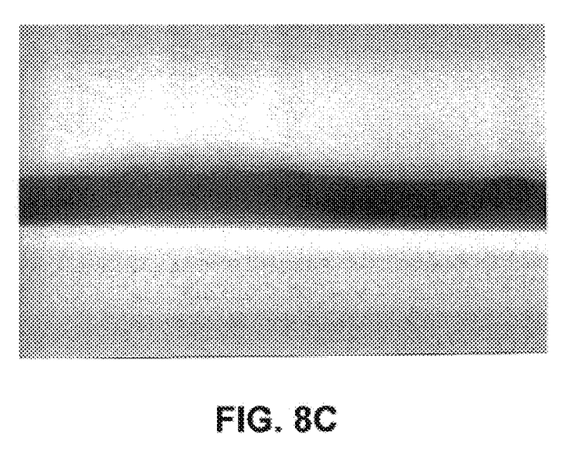

Example 6
EFE-PEB vs. Standard PEB: Cross-Section and Field Direction Comparison Three samples were pattern-wise exposed to electron beam radiation. The line/space width of the exposed pattern was 0.3, 0.2, and 0.1 μm, and the exposure dose was 12 μC/cm$^2$ and all three samples were heated at 140° C. for 90 sec. during postexposure baking. FIG. 8(a) shows a standard PEB. During PEB, one sample, shown in FIG. 8(b), was the subjected to a 3 Hz, 9.8 V AC, 0.65 V DC, electrical field applied vertically in the upward direction. The other sample, shown in FIG. 8(c), was the subjected to a 3 Hz, 9.8 V AC, 0.65 V DC, electrical field applied vertically in the downward direction. It can be seen that the EFE-PEB with upward DC bias led to much better resist profile. In the resist subjected to standard PEB, the resist lines were developed due to severe feet etching. While, in the sample where the EFE-PEB was applied with a downward DC bias, the T-topping effect was much more severe as the photoacid was driven down to the bottom of the resist.

Example 7
EFE-PEB vs. Standard PEB: Cross-Section Comparison

Figure 9A:
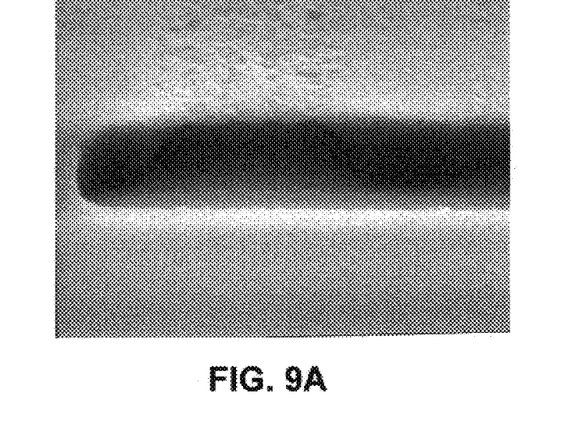
Figure 9B:
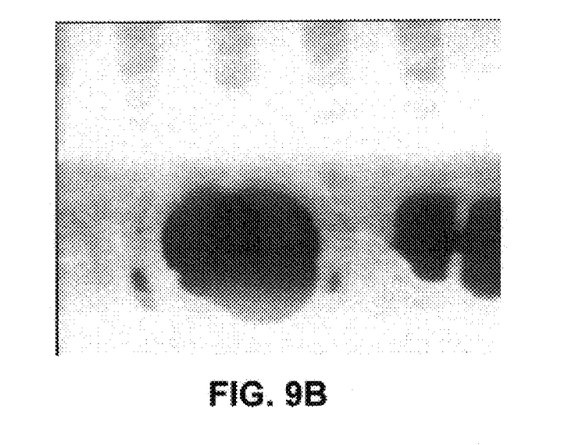
Figure 9C:
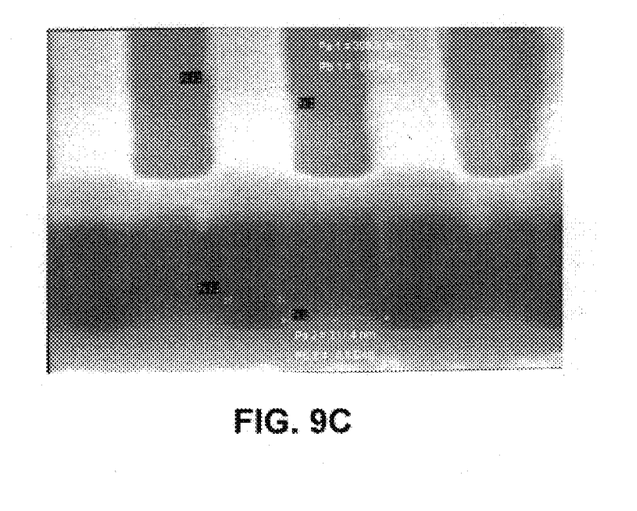

Three samples were pattern-wise exposed to electron beam radiation. The line/space width of the exposed pattern was 0.2 μm, 0.2 μm, and 0.3 μm, respectively, the exposure dose was 9 μC/cm$^2$. During PEB, one sample, shown in FIG. 9(a), was subjected to standard PEB at 140 C. for 90 sec. The second and third samples, shown in FIGS. 9(b) and 9(c), were subjected to a 3 Hz alternating 9.8V electric field, with a 0.65V upward constant voltage offset, and heated at 140 C. for 90 sec. It can be seen that under the standard PEB, all five resist lines were developed while the top still remains. Using the EFE-PEB process, however, the five resist lines were all intact and the T-top effect was significantly reduced, particularly in the 0.3 μm resist, i.e., FIG. 9(c).

Examples 8–10
EFE-PEB vs. Standard PEB: Line/Space Comparison

Table I shows the L/S values due to EFE-PEB and standard PEB. The resists were heated at 140° C. for 90 sec. In all cases the remaining resist line was widened by at least 40 nm.

TABLE I

LINE/SPACE (L/S) VALUES FROM EFE-PEB AND STANDARD PEB

| | | LINE/SPACE RATIOS IN NM | | |
|---|---|---|---|---|
| EXAMPLE | DOSE | DESIGN | STANDARD PEB | EFE-PEB |
| 8 | 15 μC/cm$^2$ | 300/300 | 190/483 | 267/434 |
| 9 | 9 μC/cm$^2$ | 300/300 | 215/388 | 253/332 |
| 10 | 9 μC/cm$^2$ | 500/500 | 358/600 | 430/538 |

We claim:

1. A process for generating a resist image on substrate, comprising the steps of:
   (a) providing a substrate coated with a film of a photoresist co position comprised of a resist binder and a radiation-sensitive acid generator;
   (b) exposing the film selectively to a predetermined pattern of radiation;
   (c) subjecting the exposed film to postexposure baking while a plying an alternating electric field to the exposed film, so as to form a latent, patterned image in the film, wherein the alternating electric field has a peak-to-peak voltage of 2V; an
   (d) developing the latent image with a developer.

2. The process of claim 1, wherein the resist is a positive resist.

3. The process of claim 2, wherein the resist is a negative resist.

4. The process of claim 1, wherein the radiation is ultraviolet radiation.

5. The process of claim 4, wherein the ultraviolet radiation is deep ultraviolet radiation.

6. The process of claim 5, wherein the deep ultraviolet radiation has a wavelength of about 248 nm.

7. The process of claim 6, wherein the deep ultraviolet radiation has a wavelength of about 193 nm.

8. The process of claim 6, wherein the deep ultraviolet radiation has a wavelength of about 157 nm.

9. The process of claim 1, wherein the radiation is electron-beam radiation.

10. The process of claim 1, wherein the radiation is X-ray radiation.

11. The process of claim 1, wherein the radiation is extreme ultraviolet radiation.

12. The process of claim 11, wherein the extreme ultraviolet radiation has a wavelength of about 13.4 nm.

13. The process of claim 1, wherein the postexposure baking comprised heating to a temperature in the range of about 90° C. to about 150° C. for a time period of from 30 seconds to about 120 seconds.

14. The process of claim 1, wherein the electric field is applied from within the resist.

15. The process of claim 1, wherein the alternating electric field has an offset bias.

16. The process of claims 15, wherein the offset bias has a voltage up to approximately 75% of V.

17. The process of claim 15, wherein the offset bias is applied vertically in an upward direction.

18. The process of claim 15, wherein the offset bias is applied vertically in a downward direction.

19. The process of claim 1, wherein after step (b) and before step (c) a second layer of photoresist is applied to the film, thus forming a second film layer and then step (b) is repeated with a different or identical pattern of exposure.

20. The process of claim 1, wherein the alternating electric field has no offset bias.

21. The process of claim 1, wherein the alternating electric field has a frequency in the range of about 1 Hz to about 1 kHz.

22. The process of claim 21, wherein the frequency in the range of about 3 Hz to about 10 kHz.

23. A method of forming a patterned material structure on a substrate, the substrate being selected from the group consisting of semiconductors, ceramics and metals, the method comprising:
  (a) optionally providing the substrate with an underlayer;
  (b) applying a positive photoresist composition to the substrate or underlayer-coated substrate to form a photoresist layer, said photoresist composition comprising a radiation-sensitive acid generator;
  (c) optionally coating the photoresist layer with a protective co ting;
  (d) patternwise exposing the substrate to radiation whereby acid is generated by the radiation-sensitive acid generator in exposed regions of the photoresist layer;
  (e) subjecting the exposed photoresist layer to postexposure being while applying an alternating electric field so as to form a latent, patterned image in the film, wherein the alternating electric field has a peak-to-peak voltage of 2V;
  (f) contacting the substrate with an aqueous alkaline developer solution, whereby the exposed regions of the photoresist layer are selectively dissolved by the developer solution to reveal a resist structure pattern; and
  (g) transferring the resist structure pattern to the substrate by etching into the substrate or underlayer-coated substrate through spaces in the resist structure pattern.

24. The method of claim 23, wherein the radiation is ultraviolet radiation.

25. The method of claim 23, wherein the radiation is electron-beam radiation.

26. The method of claim 23, wherein the radiation is X-ray radiation.

27. The method of claim 26, wherein the ultraviolet radiation is deep ultraviolet radiation.

28. The method of claim 27, wherein the deep ultraviolet radiation has a wavelength of about 248 nm.

29. The method of claim 27, wherein the deep ultraviolet radiation has a wavelength of about 193 nm.

30. The method of claim 27, wherein the deep ultraviolet radiation has a wavelength of about 157 nm.

31. The method of claim 23, wherein the radiation is extreme ultraviolet radiation.

32. The method of claim 31, wherein the extreme ultraviolet radiation has a wavelength of about 13.4 nm.

33. The method of claim 23, wherein steps (b) through (are repeated at least once.

34. The method of either one of claim 23 and 33, wherein the electric field is generated from inside the photoresist layer.

35. The method of claim 34, wherein the offset bias is applied vertically in a downward direction.

36. The method of claim 23, wherein the alternating electric field has an offset bias.

37. The method of claims 36, wherein the offset bias has a voltage up to approximately 75% of V.

38. The method of claim 36, wherein the field offset bias is applied vertically in an upward direction.

39. The method of claim 23, wherein the alternating electric field has no offset bias.

40. The method of claim 31, wherein the alternating electric field has a frequency in the range of about 1 Hz to about 1 kHz.

41. The method of claim 40, wherein the frequency is in the range of about 3 Hz to about 10 kHz.

42. A method of forming a patterned material structure on a substrate, the material being selected from the group consisting of semiconductors, ceramics and metals, the method comprising:
  (a) optionally providing the substrate with an underlayer;
  (b) applying a negative photoresist composition to the substrate or underlayer-coated substrate to form a photoresist layer, said photoresist composition comprising a resist binder, radiation-sensitive acid generator and a crosslinking agent effective to crosslink the resist binder;
  (c) optionally coating the photoresist layer with a protective co ting;
  (d) patternwise exposing the substrate to radiation whereby acid is generated by the radiation-sensitive acid generator in exposed regions of the photoresist layer;
  (e) subjecting the exposed photoresist layer to postexposure being while applying an alternating electric field so as to form a latent, patterned image in he photoresist layer, wherein the alternating electric field has a peak-to-peak voltage of 2V;
  (f) contacting the photoresist layer with an aqueous alkaline developer solution, whereby the exposed regions of the photoresist layer are selectively dissolved by the developer solution to reveal a resist structure pattern; and
  (g) transferring the negative resist structure pattern to the substrate by etching into the substrate or underlayer-coated substrate through spaces in the negative resist structure pattern.

43. The method of claim 42, wherein the radiation is ultraviolet radiation.

44. The method of claim 42, wherein the radiation is electron-beam radiation.

45. The method of claim 42, wherein the radiation is X-ray radiation.

46. The method of claim 45, wherein the ultraviolet radiation is deep ultraviolet radiation.

47. The method of claim 46, wherein the deep ultraviolet radiation has a wavelength of less than 248 nm.

48. The method of claim 46, wherein the deep ultraviolet radiation has a wavelength of 193 nm.

49. The method of claim 46, wherein the deep ultraviolet radiation has a wavelength of about 157 nm.

50. The method of claim 42, wherein the radiation is extreme ultraviolet radiation.

51. The method of claim 50, wherein the extreme ultraviolet radiation has a wavelength of about 13.4 nm.

52. The method of claim 42, wherein steps (b) through (are repeated at least once.

53. The method of either one of claim 42 and 52, wherein the electric field is generated from inside the photoresist layer.

54. The method of claim 42, wherein the alternating electric field has an offset bias.

55. The method of claims 54, wherein the offset bias has a voltage up to approximately 75% of V.

56. The method of claim 54, wherein the offset bias is applied vertically in an upward direction.

57. The method of claim 54, wherein the offset bias is applied vertically in a downward direction.

58. The method of claim 42, wherein the alternating electric field has no offset bias.

59. The method of claim 42, wherein the alternating electric field has a frequency in the range of about 1 Hz to about 1 kHz.

60. The method of claim 59, wherein the frequency is in the range of about 3 Hz to about 10 kHz.

61. In a method for generating a resist image on a substrate comprising (a) coating a substrate with a photoresist composition comprised of a resist binder and a radiation-sensitive acid generator;

(b) exposing the resist selectively to a predetermined pattern of radiation;

(c) baking the exposed resist; and (d) developing the latent image so formed with a developer, the improvement comprising applying an alternating electric field to the resist during step (c), wherein the alternating electric field has a peak-to-peak voltage of 2V.

* * * * *

UNITED STATES PATENT AND TRADEMARK OFFICE
CERTIFICATE OF CORRECTION

PATENT NO. : 6,686,132 B2
DATED : February 3, 2004
INVENTOR(S) : MoSong Cheng et al.

It is certified that error appears in the above-identified patent and that said Letters Patent is hereby corrected as shown below:

Column 16,
Line 20, after "image on", please insert -- a --.
Line 23, please delete "co position" and insert -- composition --.
Line 28, please delete "a plying" and insert -- applying --.
Line 64, please delete "claims" and insert -- claim --.

Column 17,
Line 24, please delete "ca ting" and insert -- coating --.
Line 60, please delete "(" and insert -- (d) --.

Column 18,
Line 1, please delete "claims" and insert -- claim --.
Line 24, please delete "co ting" and insert -- coating --.
Line 30, please delete "being" and insert -- baking --.
Line 31, please delete "he" and insert -- the --.
Line 62, please delete "(" and insert -- (d) --.
Line 63, please delete "claims" and insert -- claim --.

Signed and Sealed this

Fifteenth Day of June, 2004

JON W. DUDAS
*Acting Director of the United States Patent and Trademark Office*